(12) United States Patent
Tanaka et al.

(10) Patent No.: US 7,759,161 B2
(45) Date of Patent: Jul. 20, 2010

(54) SEMICONDUCTOR DEVICE AND METHOD OF MANUFACTURING THEREOF

(75) Inventors: Naotaka Tanaka, Kasumigaura (JP); Yasuhiro Yoshimura, Kasumigaura (JP); Takahiro Naito, Kodaira (JP); Takashi Akazawa, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 638 days.

(21) Appl. No.: 11/341,005

(22) Filed: Jan. 27, 2006

(65) Prior Publication Data

US 2006/0220230 A1 Oct. 5, 2006

(30) Foreign Application Priority Data

Mar. 31, 2005 (JP) ............................... 2005-100488

(51) Int. Cl.
*H01L 21/00* (2006.01)
(52) U.S. Cl. ................... 438/106; 438/107; 438/110; 257/686; 257/723; 257/774; 257/778; 257/E23.006; 257/E23.007; 257/E23.011
(58) Field of Classification Search ................ 257/686, 257/E23.021, E21.503, 723, 774, 778, E25.013, 257/E23.006, E23.007, E23.011; 438/106, 438/107, 110
See application file for complete search history.

(56) References Cited

U.S. PATENT DOCUMENTS

| | | | | |
|---|---|---|---|---|
| 5,489,750 | A * | 2/1996 | Sakemi et al. ................ | 174/261 |
| 6,239,495 | B1 * | 5/2001 | Sakui et al. ................... | 257/777 |
| 6,239,496 | B1 * | 5/2001 | Asada ........................... | 257/777 |
| 6,459,150 | B1 * | 10/2002 | Wu et al. ...................... | 257/724 |
| 6,660,944 | B1 * | 12/2003 | Murata et al. ................ | 174/261 |
| 6,692,818 | B2 * | 2/2004 | Hirano et al. ................ | 428/209 |
| 7,074,703 | B2 * | 7/2006 | Fukazawa .................... | 438/598 |
| 2001/0020549 | A1 * | 9/2001 | Horiuchi et al. ............. | 174/263 |
| 2002/0017710 | A1 * | 2/2002 | Kurashima et al. .......... | 257/686 |
| 2002/0127839 | A1 * | 9/2002 | Umetsu et al. ............... | 438/618 |
| 2004/0061238 | A1 * | 4/2004 | Sekine ......................... | 257/774 |
| 2004/0070083 | A1 * | 4/2004 | Su ............................... | 257/778 |
| 2004/0080040 | A1 * | 4/2004 | Dotta et al. .................. | 257/698 |
| 2004/0080045 | A1 * | 4/2004 | Kimura et al. ............... | 257/736 |
| 2004/0119166 | A1 * | 6/2004 | Sunohara ..................... | 257/758 |
| 2004/0188837 | A1 * | 9/2004 | Kim et al. .................... | 257/738 |
| 2005/0017338 | A1 * | 1/2005 | Fukazawa .................... | 257/686 |
| 2005/0046002 | A1 * | 3/2005 | Lee et al. ..................... | 257/678 |
| 2005/0051883 | A1 * | 3/2005 | Fukazawa .................... | 257/686 |
| 2005/0151228 | A1 * | 7/2005 | Tanida et al. ................. | 257/620 |

(Continued)

FOREIGN PATENT DOCUMENTS

JP 11-204720 7/1999

(Continued)

*Primary Examiner*—Lynne A Gurley
*Assistant Examiner*—Meiya Li
(74) *Attorney, Agent, or Firm*—Townsend and Townsend and Crew LLP

(57) ABSTRACT

In order to implement a high-density high-performance semiconductor system small in size, there is provided a method for implementing three-dimensional connection between a plurality of semiconductor chips differing from each other with the shortest metal interconnect length, using penetration electrodes, thereby enabling a fast operation at a low noise level, the method being a three-dimensional connection method very low in cost, and short in TAT in comparison with the known example, capable of bonding at an ordinary temperature, and excellent in connection reliability.

1 Claim, 11 Drawing Sheets

U.S. PATENT DOCUMENTS

2005/0167812 A1* 8/2005 Yoshida et al. .............. 257/686

FOREIGN PATENT DOCUMENTS

| JP | 11-251316 | | 9/1999 |
| JP | 2000-260934 | | 9/2000 |
| JP | 2001-196746 | A | 7/2001 |
| JP | 2002-016101 | A | 1/2002 |
| JP | 2003-303849 | A | 10/2003 |

* cited by examiner

EXTERNAL FORCE

WHEN USING A STUD BUMP

WHEN USING A PLATING BUMP

SEMICONDUCTOR DEVICE AND METHOD OF MANUFACTURING THEREOF

CLAIM OF PRIORITY

The present application claims priority from Japanese application serial JP 2005-100488 filed on Mar. 31, 2005, the content of which is hereby incorporated by reference into this application.

FIELD OF THE INVENTION

The invention relates to a semiconductor device comprising a plurality of semiconductor chips that are three-dimensionally stacked, and a method of manufacturing thereof.

BACKGROUND OF THE INVENTION

Attention has lately been focused on a system-in-package technology whereby a plurality of semiconductor chips each provided with an IC are mounted at a high density, thereby implementing a high-performance system in a short period of time, and a variety of mounting structures have since been proposed by various companies. Vigorous progress has been made in development of a stacking package capable of achieving significant reduction in size by three-dimensionally stacking a plurality of semiconductor chips, in particular.

As disclosed in, for example, Patent Document 1, because wire bonding is mainly used for electrical connection between three-dimensionally stacked semiconductor chips and a mount substrate, respectively, an upper tier chip of the stacked semiconductor chips needs to be smaller in size than a lower tier chip thereof, so that in the case of stacking semiconductor chips identical in size to each other, it becomes necessary to secure a wire bonding area by adopting a structure where a spacer is sandwiched between the respective semiconductor chips. Such electrical connection by use of the wire bonding as described has high flexibility in routing of wiring, and is therefore a very effective method for implementing electrical connection among a plurality of existing semiconductor chips with short TAT (Turn Around Time), and at a low cost.

With the electrical connection by the wire bonding, however, every metal interconnect from the plurality of the chips needs to be once dropped on the mount substrate before re-routing the same to the other chips, so that this has caused a problem that respective lengths of the metal interconnects between the respective chips become very long, and another problem that a metal interconnect density of the mount substrate becomes very high. Accordingly, this has raised a possibility of causing a problem that a production yield deteriorates owing to a higher metal interconnect density on the mount substrate to thereby cause an increase in the cost of the substrate in addition to a problem of an increase in inductance between the chips, resulting in difficulty with fast transmission. In Patent Documents 2, and 3, there has been proposed a method whereby electrodes penetrating through the interiors of the respective chips are formed for use in connection between the upper and lower chips to counter those problems associated with the electrical connection by the wire bonding. In Patent Document 2, penetration electrodes are formed concurrently with the process step of manufacturing a device comprising, for example, copper metal interconnects, thereby providing semiconductor chips with the penetration electrodes, having achieved significant simplification in manufacturing steps. In Patent Document 3, there is provided a method whereby electrodes with solder or a low-melting metal, embedded in through-holes formed in the chip by employing an electrolytic plating or electroless plating method, are formed above or below respective chips and the chips are stacked one on top of another before applying heat, thereby effecting three-dimensional connection between the chips through melt-bonding.

Patent Document 1
Japanese Patent Laid-open H 11 (1999)-204720

Patent Document 2
Japanese Patent Laid-open H 11 (1999)-251316

Patent Document 3
Japanese Patent Laid-open 2000-260934

As described above, the method of using the wire bonding is in the mainstream of the methods of packaging a plurality of semiconductor chips by three-dimensionally stacking the same, however, looking ahead, it is anticipated that the respective lengths of metal interconnects will become a bottleneck against fast transmission, and securing of wire bonding areas also will become a bottleneck against reduction in size and thickness. Further, the flip chip bonding whereby metal bumps are directly connected to electrodes on a mount substrate, respectively, has been in widespread use, however, taking into account advances being made in increase of the number of connection pins of an LSI chip, and in finer connection pitches thereof, a possibility exists that misalignment occurs between electrodes on respective chips, and the electrodes on the mount substrate, owing to, for example, a difference in thermal expansion between constituent materials, resulting in failure of bonding. Most of conventional bonding technologies are basically methods for bonding by utilizing thermal energy, including a method for causing melt-bonding of metal by heating a metal-bonding material, such as solder and so forth, in the air, a method for bonding by applying energy such as ultrasonic waves, and so forth. Accordingly, in order to implement microscopic bonding from now on, a bonding technology capable of reduction in bonding temperature, and reduction in load is indispensable.

A method for implementing three-dimensional connection between chips with the shortest metal interconnect length, using penetration electrodes, has been proposed, but since a process for forming the penetration electrodes is a novel process not included in the conventional wafer process and mounting process, it is required as preconditions for introduction of such a process that a process load is small, TAT (Turn Around Time) is short, a method for implementing connection is easy to execute, and reliability as good as in the conventional case can be ensured. For example, with the method for forming bump electrodes by causing growth of solder plating in the through-holes formed in the chip as disclosed in Patent Document 3, problems are encountered in that it normally takes a fair amount of time (several hours or more) for the growth of the solder plating, and it is technically difficult to uniformly cause the growth of the solder plating in the through-holes high in aspect ratio. Further, no sufficient mention has been made of how the semiconductor chips as finally stacked are to be connected to, for example, an organic mount substrate largely differing in coefficient of linear thermal expansion.

In view of the problems described as above, it is an object of the invention to provide a method of manufacturing a semiconductor device, capable of electrical connection between stacked chips, and between stacked chips and a metal interconnect substrate at a low cost and short TAT while using a low-temperature process at an ordinary temperature level.

SUMMARY OF THE INVENTION

The outlines of representative embodiments of the invention disclosed under the present application are briefly described as follows.

As a method whereby penetration electrodes formed in respective metal interconnect substrates, and respective semiconductor chips are used to thereby implement electrical connection between the respective chips and the respective metal interconnect substrates, and between the respective chips themselves at short TAT, a low cost, and room temperature, there is a method for achieving such a purpose, comprising the steps of forming through-holes in, for example, a resin substrate made of glass fiber not more than 50 μm thick, impregnated with epoxy resin, by laser beam machining, applying a metal plating film to the sidewalls of the respective through-holes and peripheries thereof, on the backside face side of the resin substrate, pressing a metal bump formed on top of electrodes of a semiconductor chip into contact with the interiors of the respective through-holes with the metal plated film applied thereto to be thereby inserted therein, due to a portion of the metal bump, undergoing deformation, causing the metal bumps to be geometrically caulked inside the respective through-holes formed in a metal interconnect substrate, and to be electrically connected to the metal interconnect substrate, and finally filling up gaps between the chip/the metal interconnect substrate, formed after connection via the metal bumps, with an adhesive such as an under-fill, followed by curing of the adhesive. Further, with the semiconductor chip mounted over the metal interconnect substrate, a thickness of the chip is reduced by machining the backside face of the chip to a predetermined thickness by back-grinding, through-holes reaching respective electrodes on the surface layer side are formed at positions on the backside face, corresponding respective external electrodes on the side of a device, by dry etching, a metal plating film is applied to the sidewalls of the respective through-holes and peripheries thereof, on the backside face side of the chip, a metal bump formed on top of respective electrodes on the backside face side of the metal interconnect substrate to be stacked on the upper tier side is pressed into contact with the interiors of the respective through-holes with the metal plated film applied thereto to be thereby inserted therein, due to a portion of the metal bump, undergoing deformation, causing the metal bumps to be geometrically caulked inside the respective through-holes formed in the chip, and to be electrically connected to the metal interconnect substrate, and finally, gaps formed after connection via the metal bumps are filled up with an adhesive such as an under-fill, followed by curing of the adhesive. By the method described as above, a plurality of the semiconductor chips can be three-dimensionally connected with each other through the intermediary of the metal interconnect substrate with the penetration electrodes formed therein.

Advantageous effects of the representative embodiments of the invention disclosed under the present application are briefly described as follows.

(1) It becomes possible to implement three-dimensional connection between a plurality of LSI chips with the shortest interconnect length, thereby obtaining the following advantageous effects.

(2) Since the metal bumps inserted into the respective through-holes, due to plastic flow at the time of pressure contact with the respective through-holes, can be held in a state of stable bonding with plating electrodes in the respective through-holes owing to respective spring back actions of the metal bumps, electrical connection can be implemented simply by pressure contact at an ordinary temperature (temperature in the range of from 0 to 30° C.).

(3) As electrical connection can be implemented at an ordinary temperature, it becomes possible to implement stable electrical connection even between constituent materials with a large difference in thermal expansion therebetween like, for example, between an organic metal interconnect substrate, and a semiconductor chip in spite of a future trend for finer connection pitches.

(4) Further advantageous effects can be obtained such that an apparatus similar to one for the conventional pressure contact process using gold stud bumps can cope with a process for the connection described as above, use of a heating process is not necessarily needed, and so forth.

DETAILED DESCRIPTION OF THE PREFERRED EMBODIMENTS

Figure 1:
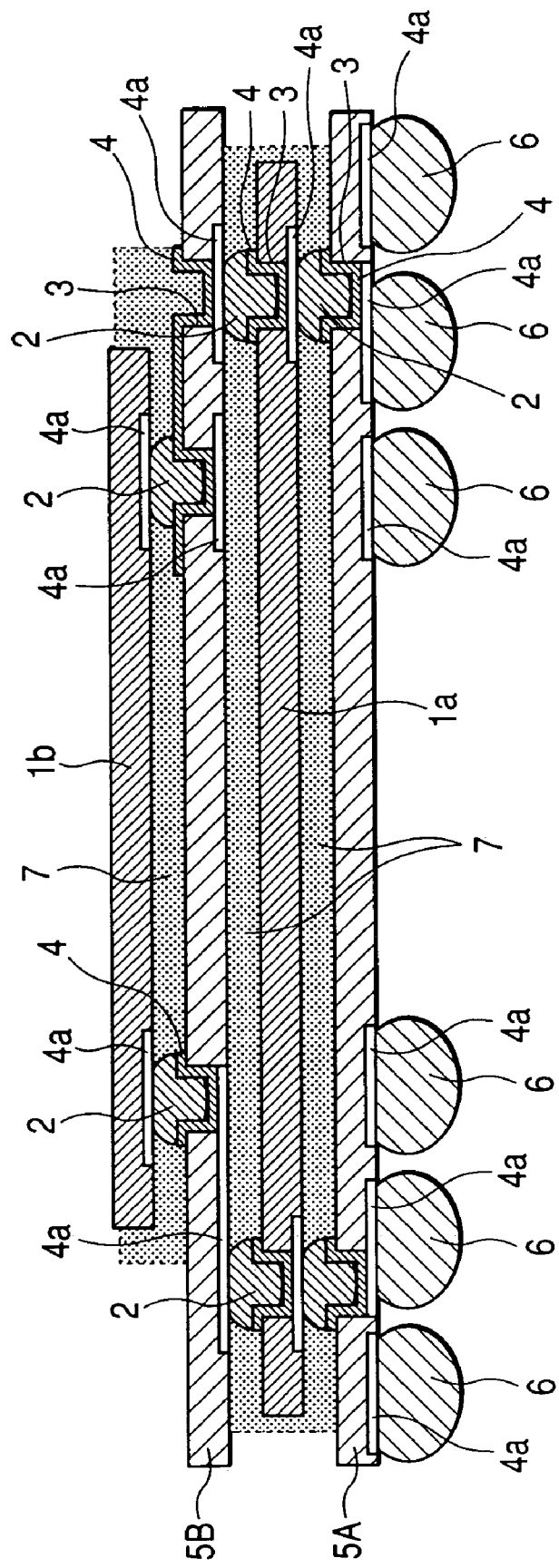
FIG. 1 is a schematic sectional view showing a schematic structure of Embodiment 1 of a semiconductor device according to the invention.

Embodiments of the invention are described in detail hereinafter with reference to the accompanying drawings. In all figures for describing the embodiments of the invention, parts having identical functions, respectively, are denoted by like reference numerals, thereby omitting repeated description thereof.

Embodiment 1

Figure 3:
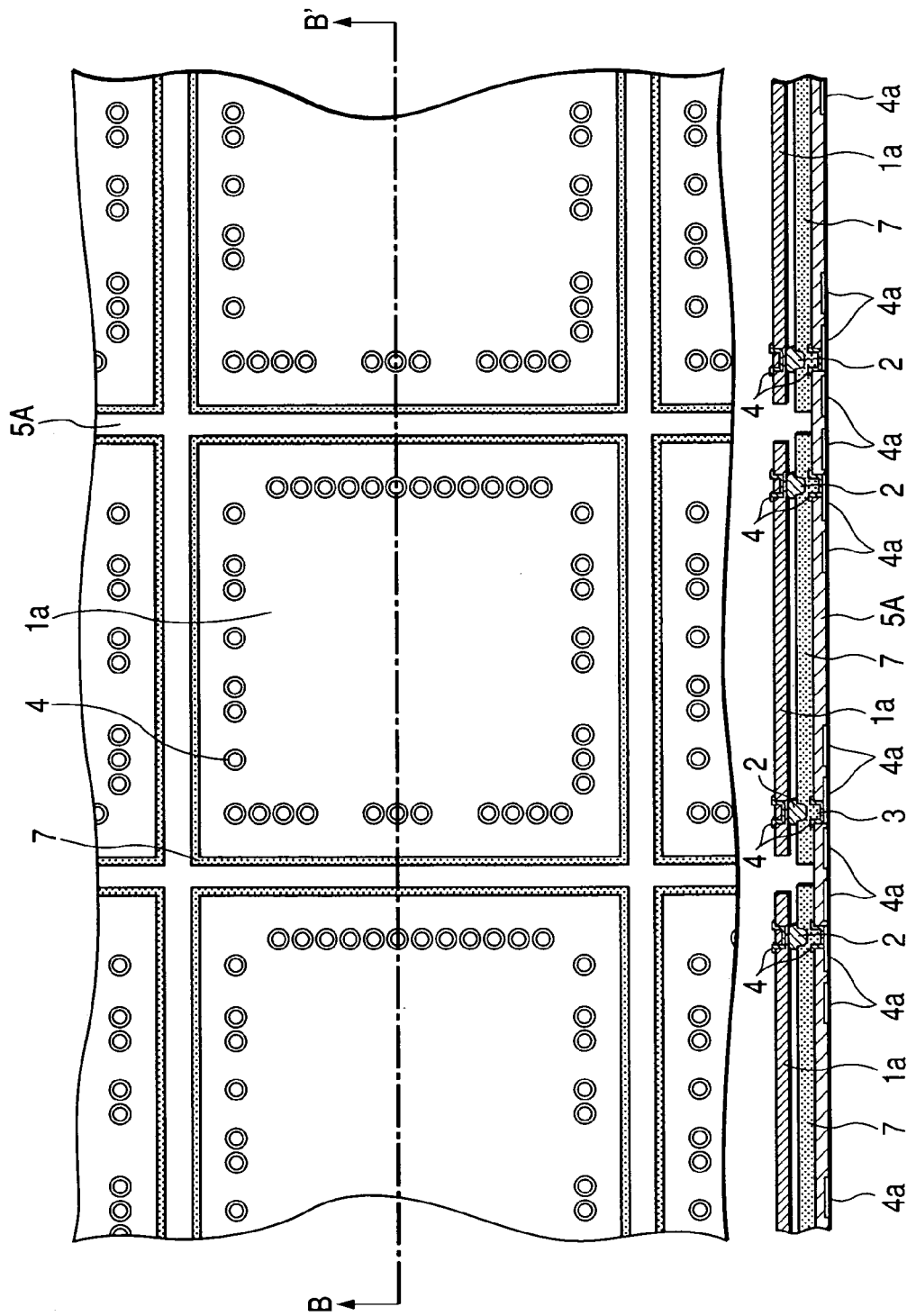
FIG. 3 shows a schematic plan and a sectional view of another method of assembling the semiconductor device according to Embodiment 1.
Figure 4:
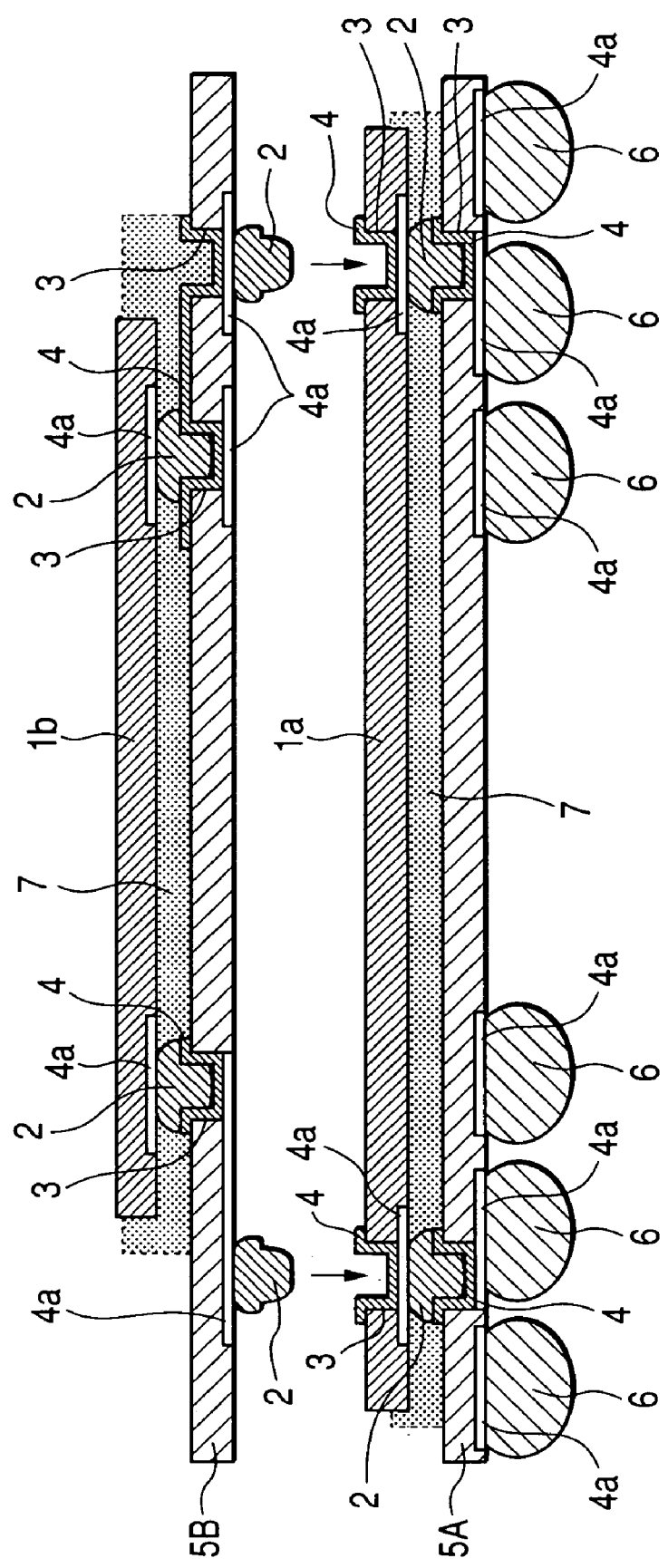
FIG. 4 is a schematic sectional view showing a method of assembling the semiconductor device according to Embodiment 1.
Figure 5:
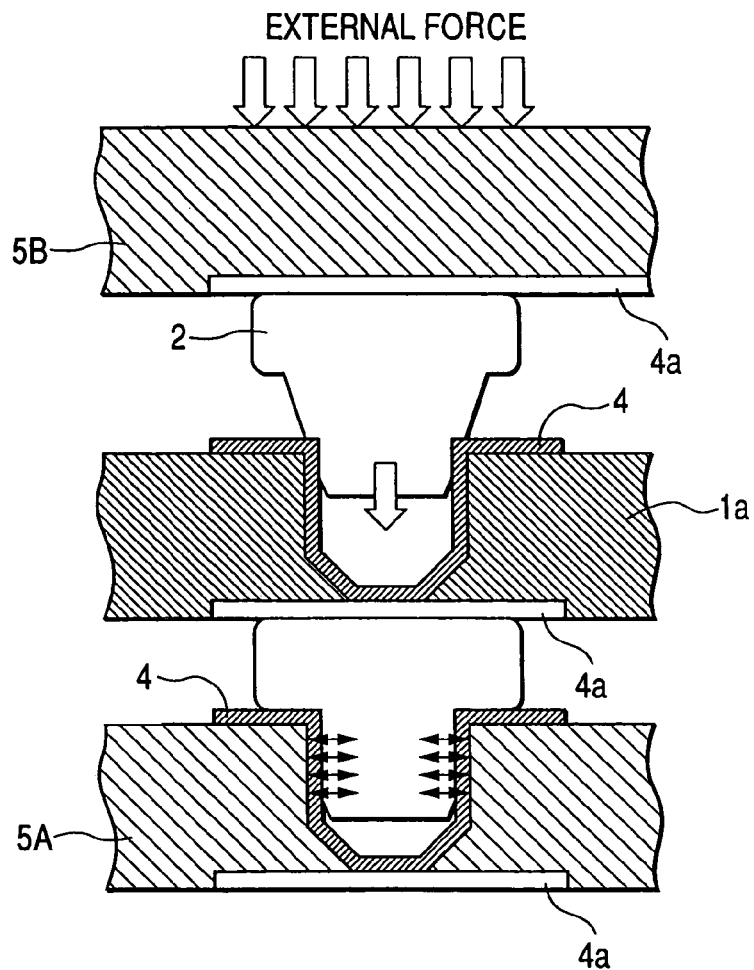
FIG. 5 is a view showing the principle of electrical connection between chips or between the chip and the metal interconnect substrate.

FIGS. 1 to 4 are views concerning Embodiment 1 of a semiconductor device according to the invention, and FIGS. 5 to 7 are enlarged sectional views each showing a detailed structure of a penetration electrode.

As shown in FIG. 1, the semiconductor device according to Embodiment 1 has a package structure provided with a laminate of chips three-dimensionally stacked on a main face of a metal interconnect substrate 5A for connection with an external substrate (hereinafter referred to merely as a metal interconnect substrate). With Embodiment 1, for example, two different semiconductor chips 1a, 1b, and a metal interconnect substrate 5B (hereinafter referred to merely as an interposer substrate) sandwiched therebetween, serving as an interposer for connection between the upper semiconductor chip and the lower semiconductor chip, are three-dimensionally stacked although Embodiment 1 is not limited thereto.

The metal interconnect substrate 5A and the interposer substrate 5B each are made up of a resin substrate formed of a glass fiber impregnated with epoxy resin or polyimide resin although not limited thereto, and a plurality of electrode pads formed of respective portions of a plurality of metal interconnects are disposed on the main face of the metal interconnect substrate 5A, and on a main face of the interposer substrate 5B, respectively, while a plurality of electrode pads formed of respective portions of the plurality of the metal interconnects are disposed on respective backside faces thereof, on a side thereof, opposite from the respective main faces. Through-via holes for electrical connection of the respective electrode pads of the main face with the respective electrode pads on the backside face are formed in areas identical to each other on the respective electrode pads of the main face. For example, a solder bump 6 serving as an external connection terminal (an external electrode) is electrically and mechanically connected to each of the plurality of the electrode pads on the backside face of the metal interconnect substrate 5A.

The semiconductor chip 1a is made up so as to have through-holes 3 provided in such a way as to correspond to the plurality of the electrode pads 4a on the side of a device, respectively, and to have a plurality of penetration electrodes 4. The respective through-holes 3 are formed so as to extend from the backside face of the semiconductor chip 1a, and to reach the respective electrode pads 4a on the side of the device through a semiconductor substrate (silicon), and a multi-layer thin-film body. The respective penetration electrodes 4 are formed along respective electrode pads 4a provided on the main face (circuit face) of the semiconductor chip 1a, and the respective inner wall faces of the through-holes 3 so as to be electrically connected to the respective electrode pads 4a. With Embodiment 1, the respective penetration electrodes 4 are drawn out to the backside face of the semiconductor chip 1a, and are formed so as to cover respective backside faces of the electrode pads 4a.

Figure 2:
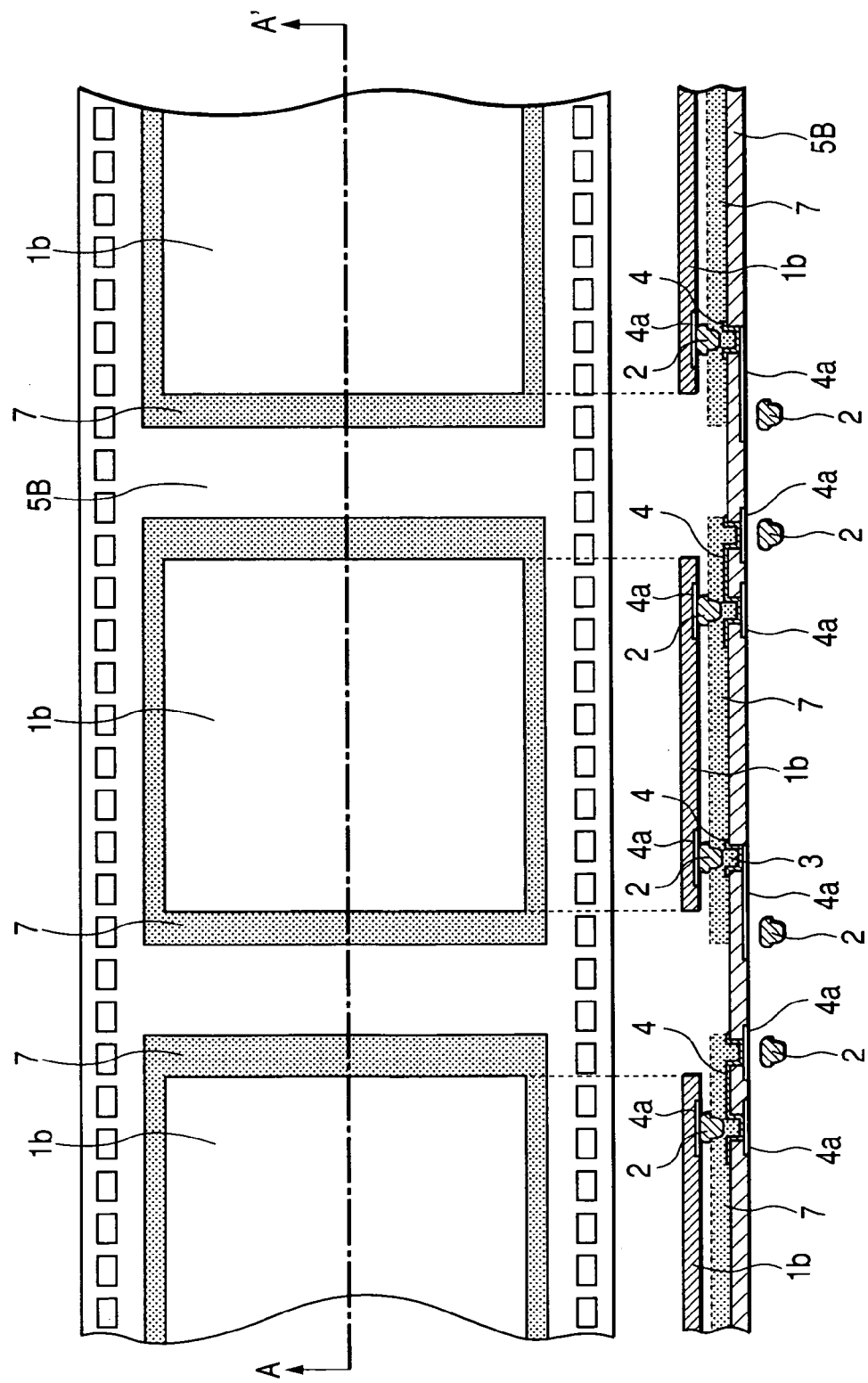
FIG. 2 shows a schematic plan and a sectional view of a method of assembling the semiconductor device according to Embodiment 1.

FIGS. 2 to 4 show a method of manufacturing the package structure having the laminate of the chips as shown in FIG. 1.

FIG. 2 shows a method of connecting the semiconductor chip 1b with the flexible interposer substrate 5B formed in a reel-tape fashion. A through-hole 3 for electrical connection of the respective electrode pads of the main face of the interposer substrate 5B with the respective electrode pads on the backside face thereof is formed on the respective electrode pads of the main face, in the same areas as those of the respective electrode pads on the main face. The through-holes 3 are a plurality of holes reaching the interconnect on the side of the interposer substrate 5B, opposite from the main face, formed by laser beam machining, and a plating electrode is formed so as to extend from the bottom side of each of the holes, along the sidewall thereof, toward the main face side, thereby electrically interconnecting the respective metal interconnects on the main and backside faces via the respective penetration electrodes 4. Now, stud bumps 2 formed on the underside of the semiconductor chip 1b are each inserted into the respective through-holes 3 of the interposer substrate 5B to be thereby electrically connected with the respective electrode pads 4a of the interposer substrate 5B in a lower tier. Each of the stud bumps 2 is pressed into contact with the respective through-holes 3 to be thereby inserted therein, due to a portion thereof undergoing deformation accompanied by plastic flow. As a result, a contact pressure is caused to act between the stud bump and the plating electrode formed along the respective inner walls of the through-holes 3, thereby achieving electrical continuity. Accordingly, the stud bumps for use in this case are preferably composed of material susceptible to plastic deformation due to application of an external force, and may be composed of a gold-based material stable in composition, indium as a low-melting metal, and so forth. By a process described as above, the semiconductor chip 1b is sequentially connected to the top of the interposer substrate 5B having the through-holes 3, formed in the reel-tape fashion. The interposer substrate 5B is also provided with test pads formed for use in conducting an operation test of the semiconductor chip 1b, thereby enabling selection on non-defective products thereof to be implemented. As with the semiconductor chip 1b, a stud bump 2 is formed on respective electrode pads formed on the underside of the interposer substrate 5B to be then divided into individual pieces, thereby forming a semiconductor package structure comprising the interposer substrate 5B, and the semiconductor chip 1b.

FIG. 3 shows a method of connecting the semiconductor chips 1a to the flexible metal interconnect substrate 5A that is formed in a matrix-sheet fashion. As with the interposer substrate 5B, a through-hole 3 for electrical connection of the respective electrode pads 4a of the main face of the interposer substrate 5A with the respective electrode pads on the backside face thereof is formed on the respective electrode pads on the main face of the metal interconnect substrate 5A, in the same areas as those of the respective electrode pads on the main face. As with the semiconductor chip 1b, stud bumps 2 are formed on the underside of the semiconductor chip 1a provided with through-holes 3, positioned on a lower tier side of the device, and the stud bumps 2 each are inserted into the respective through-holes 3 of the metal interconnect substrate 5A for electrical connection with the respective electrode pads 4a of the metal interconnect substrate 5A. Those stud bumps 2 as well are each pressed into contact with the respective through-holes 3 to be thereby inserted therein, due to a portion thereof undergoing deformation accompanied by plastic flow. As a result, a contact pressure is caused to act between the stud bump and the plating electrode formed along the respective inner walls of the through-holes 3, thereby achieving electrical continuity. By a process described as above, the semiconductor chip 1a is sequentially connected in the matrix fashion to the metal interconnect substrate 5A having the through-holes 3, made up of a matrix-sheet. As with the case of the interposer substrate 5B, the metal interconnect substrate 5A is also provided with test pads formed for use in conducting an operation test of the semiconductor chip 1a, thereby enabling selection on non-defective products thereof to be implemented.

FIG. 4 shows a method for executing laminating-connection of respective semiconductor packages with each other, individualized as shown in FIGS. 2, and 3. The semiconductor package with the semiconductor chip 1b mounted on the interposer substrate 5B has the stud bumps 2 formed on the respective electrode pads on aside of the interposer substrate 5B, opposite from the main face thereof. The stud bump 2 is inserted into the respective through-holes 3 of the semiconductor chip 1a of the semiconductor package with the semiconductor chip 1a with the through-holes 3, mounted on the metal interconnect substrate 5A, whereupon the semiconductor chip 1a, and the semiconductor chip 1b are electrically connected with each other via the interposer substrate 5B.

FIG. 5 is a view showing the principle of electrical connection at junctions between the chips or between the chip and the metal interconnect substrate. In this case, the stud bump 2 formed on the underside of the interposer substrate 5B is pressed into contact with a recess 3 for a backside face penetration electrode, formed in the semiconductor chip 1a on the lower tier side of the interposer substrate 5B, by an external force applied from the upper surface of the interposer substrate 5B, to be thereby inserted therein, due to a portion of the stud bump 2, undergoing deformation accompanied by plastic flow. Owing to a springback action of the stud bump 2 after removal of a load caused by pressure contact, there occurs a contact pressure against the sidewall of the recess for the penetration electrode, thereby achieving electrical continuity in a dynamically-caulked state. Accordingly, there is no need for causing bonding through a metallurgical and chemical-bond reaction, enabling electrical connection between the chips or between the chip and the metal interconnect substrate to be effected simply through pressure contact at room temperature. Particularly, in the case where the stud bump 2 is pressed into contact with the recess for the penetration electrode, formed in the metal interconnect substrate, elastic deformation occurs to the matrix portion of the metal interconnect substrate, as well, and it is therefore presumed that insertion through pressure contact at a lower load can be achieved.

Now, the different semiconductor chips 1a, 1b, disposed below and above, respectively, are electrically connected with each other via a rewiring layer, and, for example, a rewiring layer 5B-1 on a side of the interposer substrate 5B, adjacent to a surface layer, is mainly used for connection between signal pins of the below and above semiconductor chips 1a, 1b, respectively, while a rewiring layer 5B-2 formed on a side of the interposer substrate 5B, adjacent to the backside face thereof, through the intermediary of the penetration electrode 4, is used for connection between a power supply and ground pin, shared by the semiconductor chip 1b on the upper tier side, and the semiconductor chip 1a on the lower tier side. More specifically, by forming the power supply/ground plane layer, shared by the below and above semiconductor chips 1a, 1b, respectively, on the backside face side of the interposer substrate 5B, the below and above semiconductor chips 1a, 1b, respectively, are connected with each other substantially equivalently with the shortest interconnect length from the power supply/ground plane layer formed on the backside face side of the interposer substrate 5B. The interposer substrate 5B is electrically connected to the through-holes formed at respective positions of the power supply/ground pins of the semiconductor chip 1a on the lower tier side by the method for executing the laminating-connection described as above, and the respective through-holes to be electrically connected to the backside face side are formed directly above respective electrode positions of the interposer substrate 5B as connected. Rewiring between the respective through-holes and electrode positions at respective positions of the power supply/ground pins of the semiconductor chip 1b on the upper tier side is executed on the backside face side of the interposer substrate 5B. Further, rewiring between the power supply pins, and between the ground pins, shared by the below and above semiconductor chips 1a, 1b, respectively, is executed on the backside face side of the interposer substrate 5B, and in order to control occurrence of a potential difference between the pins as much as possible, mutual connection is executed by use of a thick interconnection pattern, or a plane layer with a region. As this will enable noise in a power supply system to be checked to the minimum, it is possible to implement a structure very advantageous for fast transmission. Further, in case of lack of the power supply pins that can be shared by the below and above semiconductor chips 1a, 1b, the semiconductor chip 1a on the lower tier side needs to be a dedicated chip with a dummy electrode formed at several locations for allowing an operation voltage of the semiconductor chip 1b on the upper tier side to be inputted thereto.

As described in the foregoing, with the semiconductor chip 1a in the lowermost tier, and the semiconductor chip 1b in the uppermost tier, different from each other, it is possible to implement three-dimensional connection electrically operable with the shortest interconnection length through the intermediary of the interposer substrate 5B. For example, if the semiconductor chip 1a in the lowermost tier is a high-performance microcomputer (MPU) with a GHz-band frequency capacity, and the semiconductor chip 1b in the uppermost tier is a high-speed memory (DRAM), a fast bus transmission design between the MPU and the DRAM can be developed on the interposer substrate 5B at a high density/shortest interconnection length, so that it becomes possible to construct a high-performance system in place of a system LSI comprising a process of an SOC (System on Chip) mixed with a large-capacity memory. As long-distance connection between the pins such as that in the case of board mounting is normally assumed, a signal drive capability is enhanced at the expense of high-speed/low power consumption of input/output circuits of the respective chips, however, as a result of implementation of connection between the chips with the shortest interconnect length, it has become possible to set drive capabilities of the input/output circuits to as low as that of the SOC, thereby accelerating fast transmission by the device, and reduction in power consumption thereof.

Figure 6:
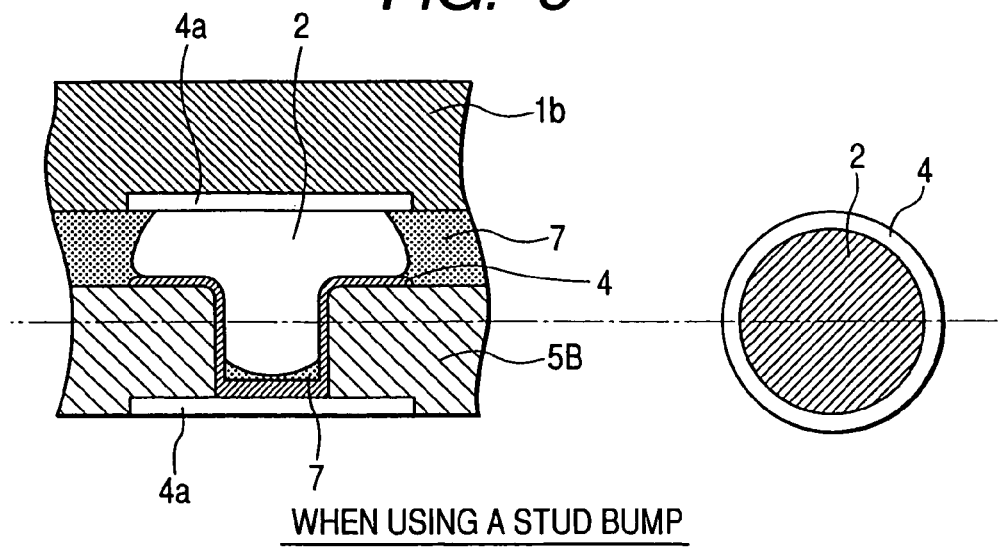
FIG. 6 is an enlarged schematic sectional view showing a junction between a penetration electrode and a through-hole, formed in a metal interconnect substrate in FIG. 1.
Figure 7:
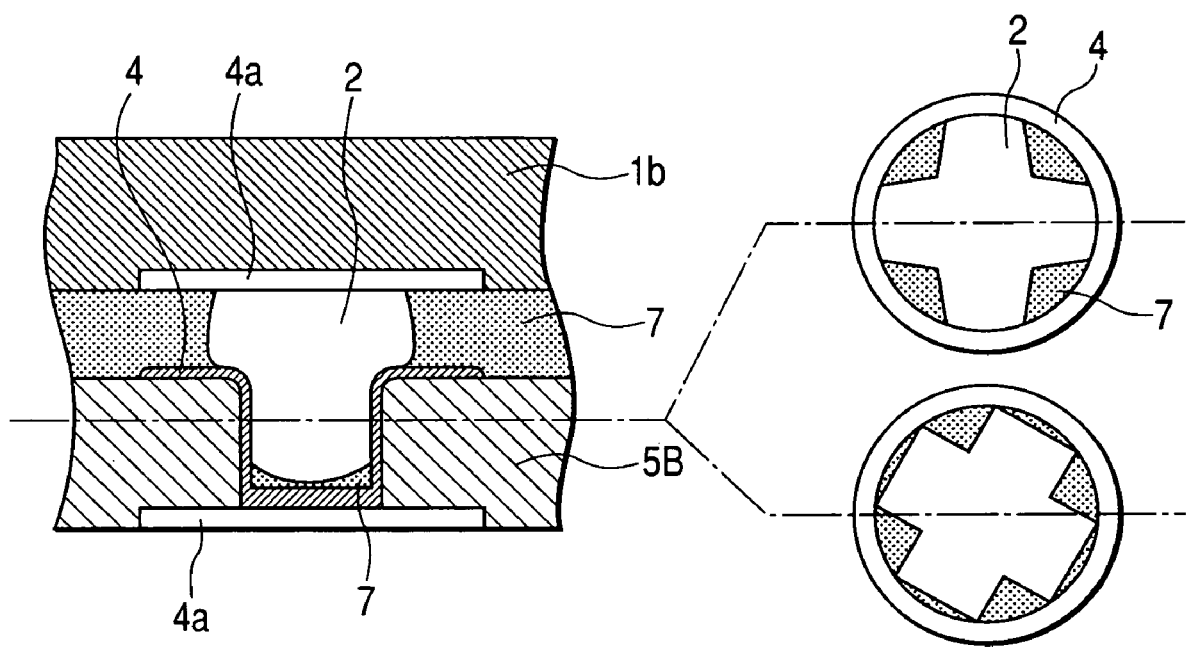
FIG. 7 is an enlarged schematic sectional view showing another junction between a penetration electrode and a through-hole, formed in a metal interconnect substrate in FIG. 1.

FIGS. 6 and 7 each show a detailed structure of a junction between the through-holes formed in the metal interconnect substrate 5A and interposer substrate 5B, respectively, and the respective bumps thereof. With both the metal interconnect substrates, an interconnect is formed on both the main and backside faces of the resin substrate formed of the glass fiber not more than 50 μm thick (on the order of 30 μm), impregnated with the epoxy resin or polyimide resin, as previously described, via the respective through-holes. In a stage where a portion of resin, in the shape of a hole, is removed by, for example, laser beam machining, and the respective metal interconnects on the main face, and on the face away from the main face are exposed, plating is applied, thereby forming the through-hole as shown in the figure. The through-hole is designed to have the inside diameter slightly smaller than the outer dimensions of a metal bump (in this case, a gold stud bump) formed on the semiconductor chip, so that upon insertion of the metal bump into the through-hole through pressure contact, elastic deformation of the through-hole of the metal interconnect substrate in addition to deformation of the bump itself, accompanied by plastic flow thereof will cause electrical conduction to be attained by dynamic actions of both the deformations. Accordingly, electrical connection between the chip and the substrate can be effected simply by a pressure contact process at an ordinary temperature (room temperature) level. FIG. 6 is a view showing a sectional shape (sections in the vertical direction and lateral direction, respectively) of a bump junction after insertion of the gold bump into the through-hole by pressure contact, and in this case, the section in the lateral direction shows that bonding is implemented in a state where the hole for the electrode is substantially filled up with bump metal. On the other hand, FIG. 7 is a view showing a sectional shape (sections in the vertical direction and lateral direction, respectively) of a bump junction after insertion of a plating bump (of gold etc.) into the through-hole by pressure contact. In this case, a bump in a shape with protrusions extended toward the circumference of the penetration electrode 4 unlike the cylindrical shape of the stud bump is formed by a plating process, and by insertion of the plating bump formed with a plurality of the protrusions into the through-hole by pressure contact, a contact pressure is caused to occur between the protrusions, and the plating electrode formed along the inner wall of the through-hole, thereby attaining electrical conduction. With adoption of a multi-point contact structure between the protrusions, and the inner wall of the through-hole, it is possible to obtain advantageous effects that the deformation volume of the bump at the time of the insertion by pressure contact can be reduced, in addition, the insertion by pressure contact at a lower load is enabled to cope with a future trend for more pins, and further, for example, in the case of making connection after initially applying sealing resin, the resin inside the through-hole can be repulsed with greater ease at the time of pressure contact. The shape of the plating bump, as shown in the figure, represents one according to an embodiment of the invention, however, other shapes of the plating bump, capable of implementing multi-point contact with the interior of the through-hole, is obviously equivalent to the shape according the invention.

Figure 8:
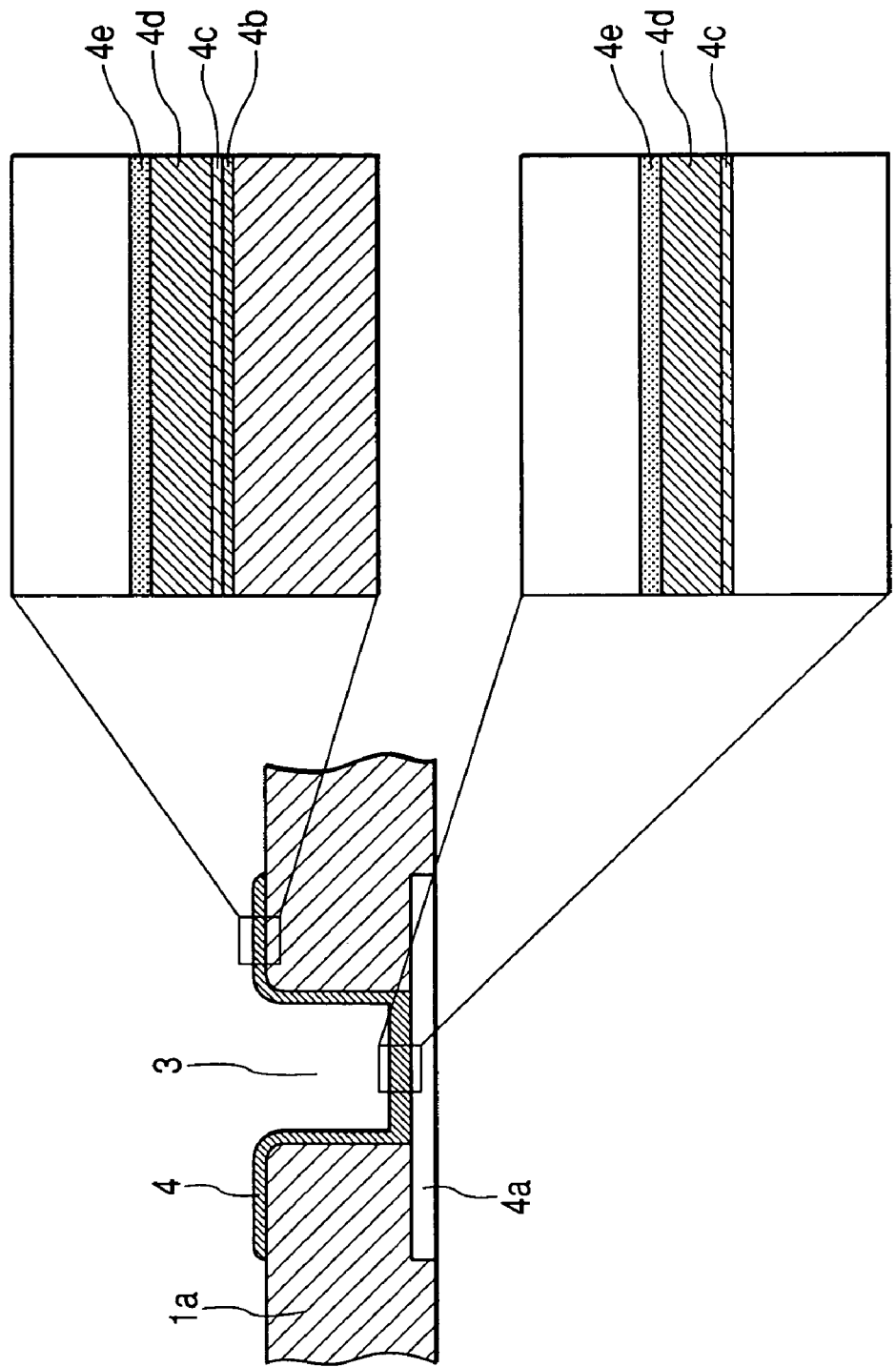
FIG. 8 is an enlarged schematic sectional view showing a penetration electrode formed in a semiconductor chip in FIG. 1.
Figure 9:
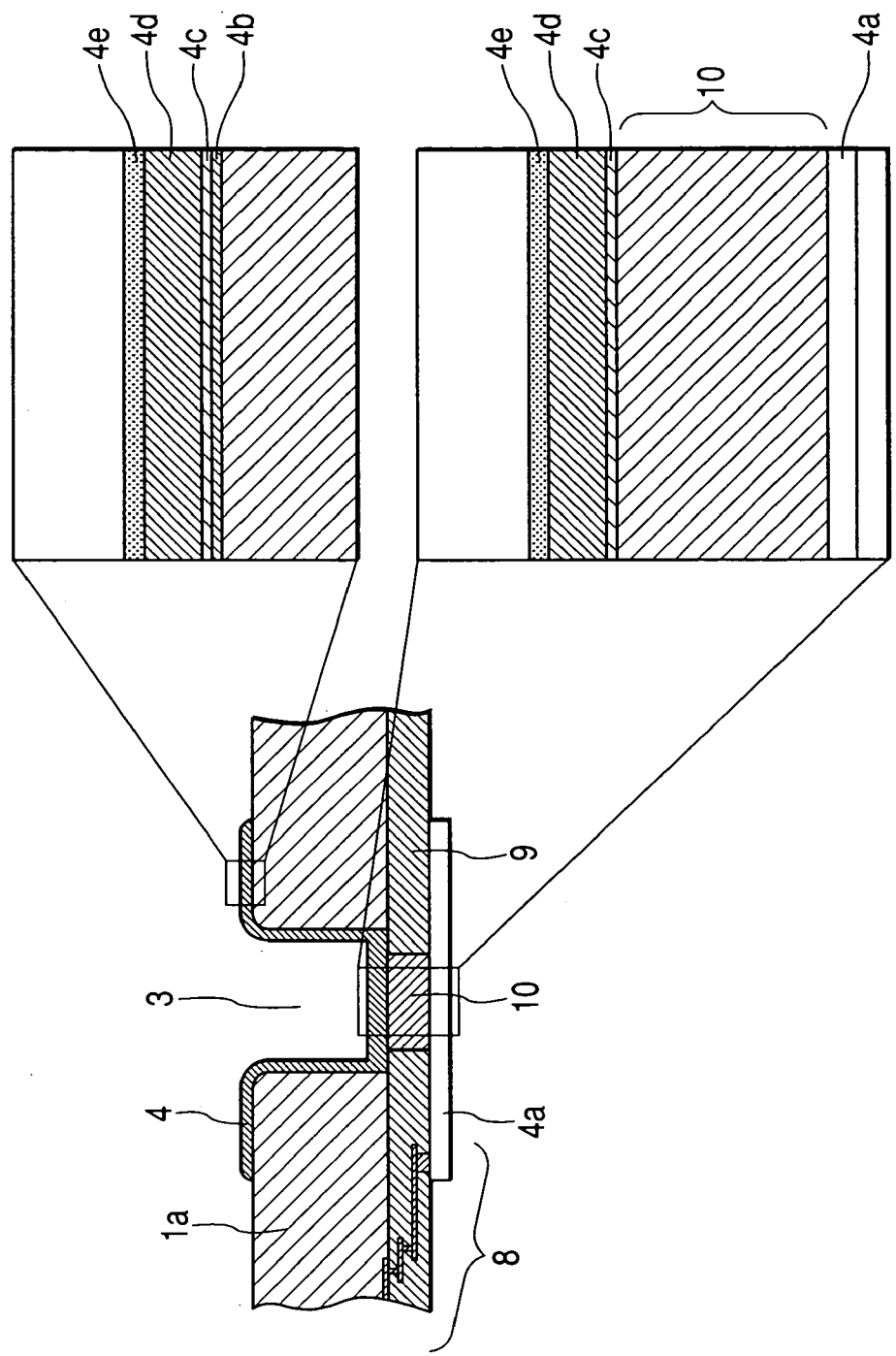
FIG. 9 is an enlarged schematic sectional view showing another penetration electrode formed in the semiconductor chip in FIG. 1.

FIGS. 8 and 9 each show a detailed structure of the through-hole formed in the semiconductor chip 1a. In FIG. 8, the through-hole is electrically insulated from the semiconductor substrate (silicon) by an insulating film provided on the backside face of the semiconductor chip 1a, and an insulating film provided along the inner wall face of the through-hole 3. A plurality of the through-holes 3 are formed on the backside face of a wafer by dry etching of silicon, and at that time, an edge of an inlet port of the through-hole, on the backside face side of the semiconductor chip 1a, is preferably worked into a shape with a radius corner as shown in the figure or a chamfered shape instead of a shape with a square angle so that a resist film used for processing in the step of etching a plating film can be continuously and uniformly applied. The inner wall of the through-hole, in section, shows that the insulating film is formed on a silicon work face by, for example, a CVD (Chemical Vapor Deposition) process, and on top of the insulating film, there are formed a metal shield layer 4c, and plating layers 4d, 4e, by electroplating although not limited thereto. From the viewpoint of ensuring adherence, electrical connection in a contact region between the electrode (penetration electrode) 4 and the electrode pad (a device-side electrode) 4a is achieved through the intermediary of the metal shield layer (Ti/Cu, Cr) 4c. Further, a part of the wafer, on the backside face thereof, is protected by another insulating film as necessary. FIG. 9 shows a vertical sectional structure of the penetration electrode, including the structure of an actual semiconductor device, by way of example. Multi-level metal interconnects 8 formed in an active area of the semiconductor device are formed such that respective portions of an interlayer dielectric 9 are interposed therebetween, and are electrically connected to the device side electrode (an Al electrode) 4a in the uppermost surface layer. Meanwhile, in the case of the conventional device structure, an interconnect layer is not formed directly underneath the device side electrode 4a in the uppermost surface layer, for connection to an external electrode, and only multi-level insulating film layers are formed. In the figure, however, concurrently with a process of forming the device side multi-level interconnect directly underneath the device side electrode 4a, a metal layer 10 in the shape of a via-hole is formed to be electrically connected to the device side electrode 4a in the uppermost surface layer. The constituent material of the metal layer 10 is composed of an electrically conductive metal, such as Al, Cu, W, and so forth, as with the case of metal interconnect layers inside the device. Prior to the formation of the penetration electrode 4, the metal layer 10 in the shape of the via-hole is electrically isolated from a Si bulk portion with a thin insulating film on the order of several hundred nm in thickness, interposed therebetween. The penetration electrode 4 with the hole is formed in the semiconductor chip having the above-described device structure, in vertical section, based on Embodiment 1 as described hereinbefore. In this case, there is no need for etching the interlayer dielectric 9 with an increased thickness, owing to a structure of the multi-level metal interconnects 8 on the device side, up to a level reaching the device side electrode 4a in the uppermost surface layer, thereby significantly lessening a process load, and simultaneously reinforcing rigidity of the electrode 4a in the uppermost surface layer. As a result, while it is possible to aim at shorter TAT in a process of forming the penetration electrode 4a, stable bonding can be attained in the case of future application of a low-k material even when using the penetration electrode 4 as an electrode for the conventional wire bonding.

Figure 10:
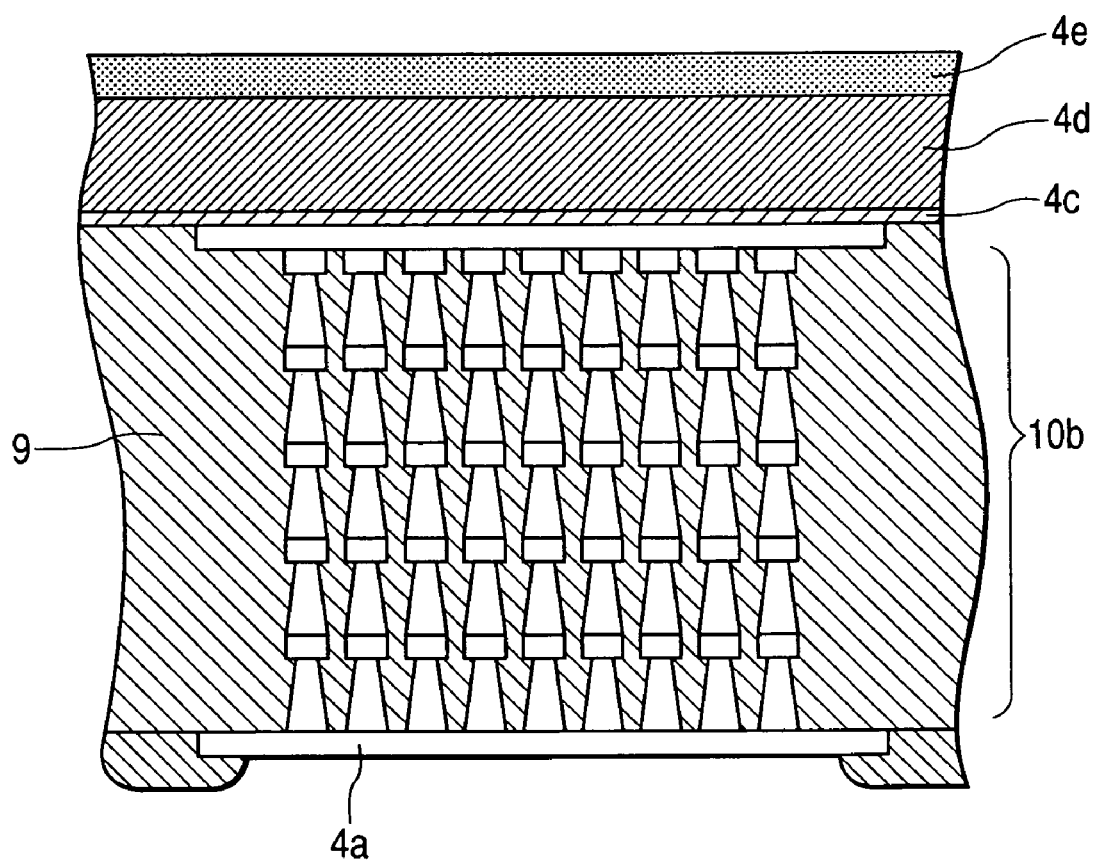
FIG. 10 is a view showing an example of a detailed structure on the side of a device in FIG. 9.

FIG. 10 is a view showing a detailed structure of a metal layer comprising via holes, formed directly underneath the device side electrode 4a in the structure shown in FIG. 9. When an actual device manufacturing process is taken into consideration, there is a possibility that it is impossible to secure matching between the formation of a via-hole as large as that shown in FIG. 9, and a process condition tuned to other interconnection patterns, and other via-hole sizes. Accordingly, by concurrently forming a plurality of miniscule via-holes as shown in the figure, equivalent in level to other interconnection patterns, and other via-hole sizes to thereby form multi-level columnar via-holes, matching the process of forming the multi-level interconnects, it becomes possible to obtain the same advantageous effect as that for the case shown in FIG. 9.

Embodiment 2

Figure 11:
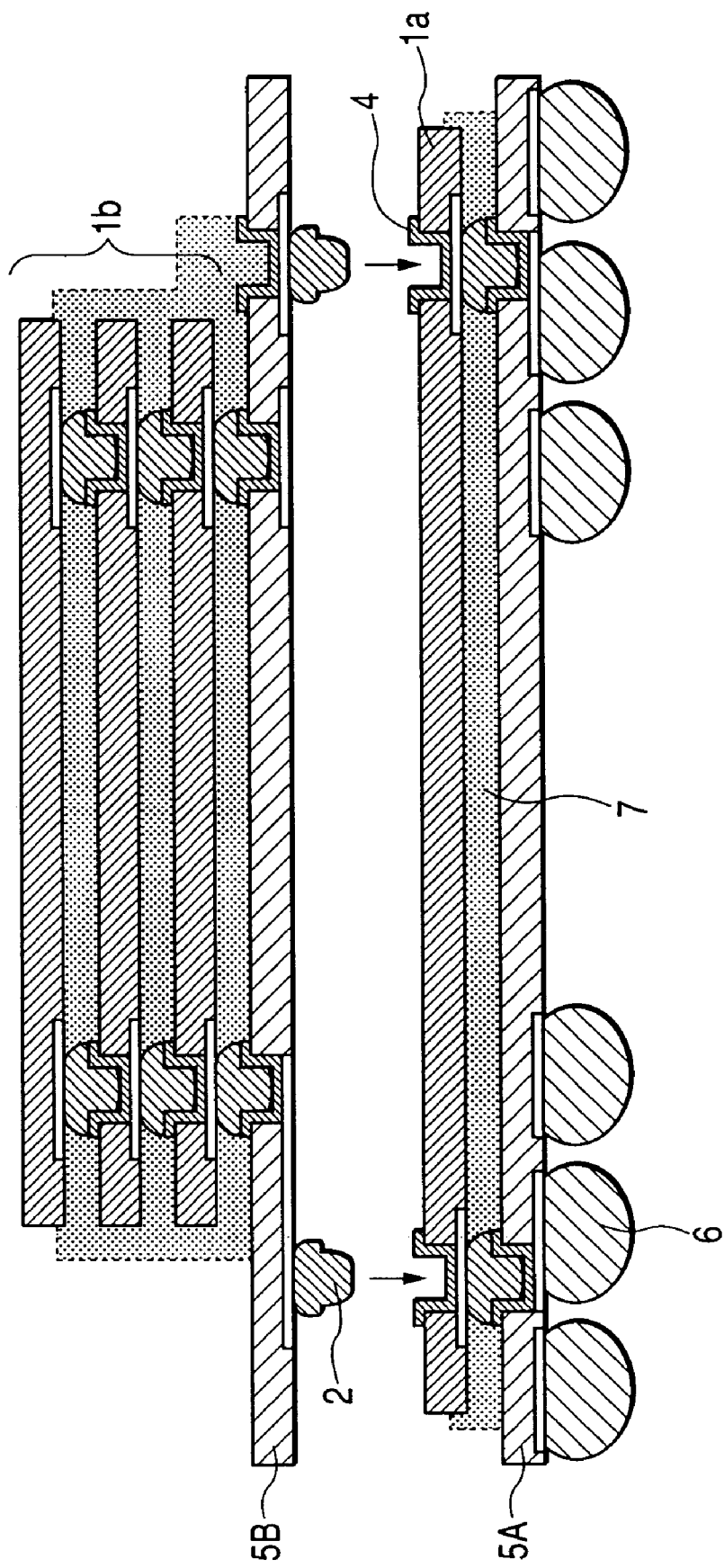
FIG. 11 is a schematic sectional view showing a schematic structure of Embodiment 2 of a semiconductor device according to the invention.

FIG. 11 is a view concerning Embodiment 2 of a semiconductor device according to the invention.

As shown in FIG. 11, the semiconductor device according to Embodiment 2 has a package structure provided with a laminate of chips three-dimensionally stacked on the main face of a metal interconnect substrate 5A. In the case of Embodiment 2, with two different semiconductor chips 1a, 1b, for example, three units of the semiconductor chips 1b as stacked one on top of another are mounted although not limited thereto, and a metal interconnect substrate 5B for connecting the chip 1a with the chips 1b is three-dimensionally stacked in between the two different semiconductor chips.

The metal interconnect substrate 5A and an interposer substrate 5B each are made up of, for example, a resin substrate formed of a glass fiber impregnated with an epoxy resin or polyimide resin although not limited thereto, and a plurality of electrode pads formed of respective portions of a plurality of metal interconnects are disposed on the respective main faces of the metal interconnect substrate 5A, and the interposer substrate 5B while a plurality of electrode pads formed of respective portions of a plurality of metal interconnects are disposed on the respective backside faces thereof, on a side thereof, opposite from the respective main faces. Through-via holes for electrical connection of the respective electrode pads of the main face with the respective electrode pads on the backside face are formed in areas identical to each other on the respective electrode pads of the main face. For example, a solder bump 6 serving as an external connection terminal (an external electrode) is electrically and mechanically connected to each of the plurality of the electrode pads on the backside face of the metal interconnect substrate 5A.

The semiconductor chip 1a is made up so as to have through-holes 3 provided in such a way as to correspond to a plurality of device side electrode pads 4a, respectively, and further, to have a plurality of penetration electrodes 4. The respective through-holes 3 are formed so as to extend from the backside face of the semiconductor chip 1a, reaching the respective device side electrode pads 4a through a semiconductor substrate (silicon), and a multi-layer thin-film body. The penetration electrodes 4 each are formed along the respective electrode pads 4a provided on the main face (circuit face) of the semiconductor chip 1a, and the respective inner wall faces of the through-holes 3 so as to be electrically connected to the respective electrode pads 4a. With Embodiment 2, the respective penetration electrodes 4 are drawn out to the backside face of the semiconductor chip 1a, and are formed so as to cover the respective backside faces of the electrode pads 4a. The semiconductor chips 1b, except the chip as stacked in the uppermost layer, are each made up so as to have through-holes 3 provided in such away as to correspond to device side electrode pads 4a, respectively, and further, to have a plurality of penetration electrodes 4 as with the semiconductor chip 1a. Those plural units of the semiconductor chips 1b and the semiconductor chip 1a are formed in accordance with the fabrication method shown in FIGS. 2 to 4, thereby implementing a three-dimensionally stacked package structure.

Embodiment 3

Figure 12:
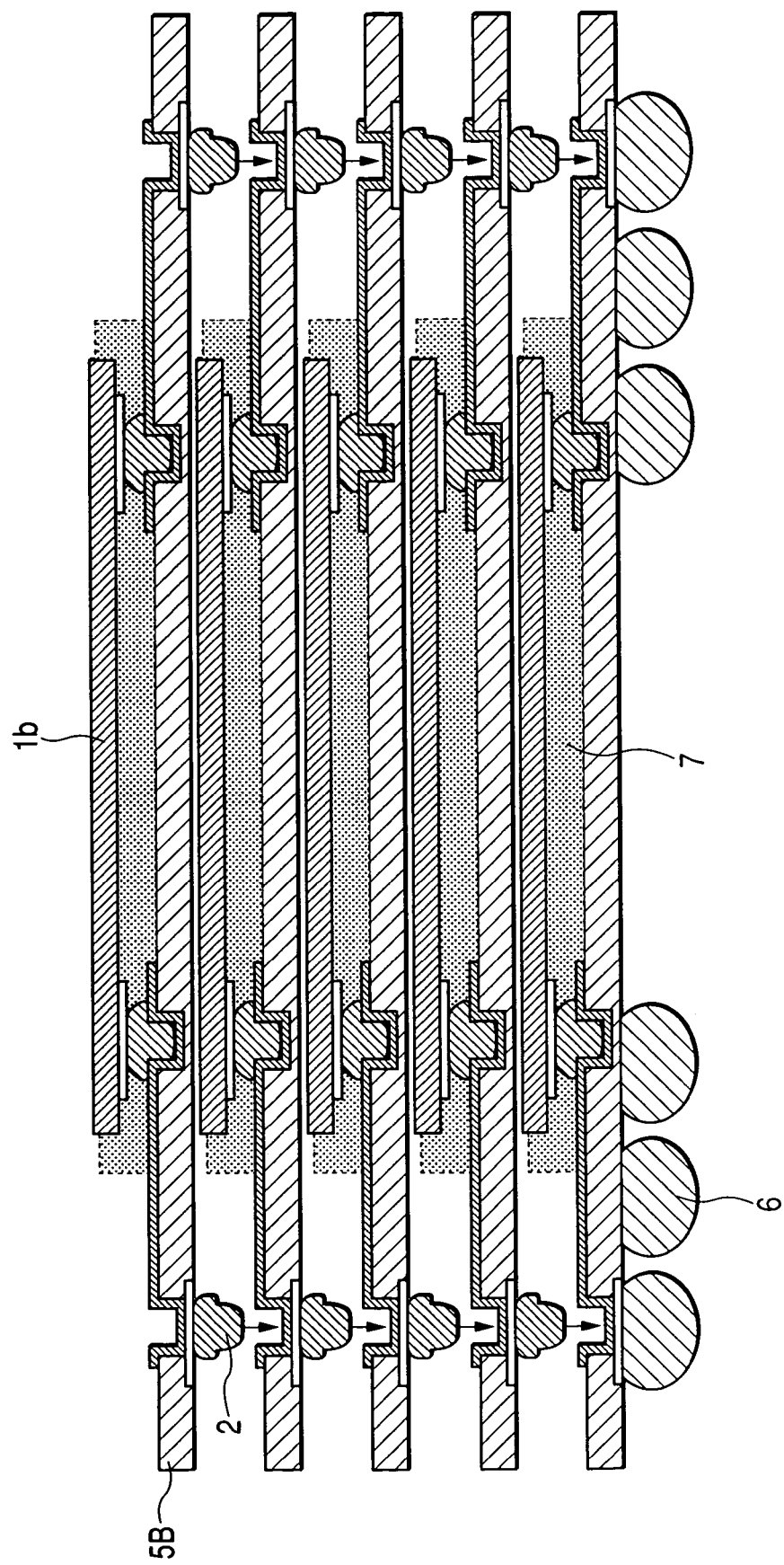
FIG. 12 is a schematic sectional view showing a schematic structure of Embodiment 3 of a semiconductor device according to the invention.

FIG. 12 is a view concerning Embodiment 3 of a semiconductor device according to the invention. The semiconductor device is manufactured by mounting a semiconductor chip over a metal interconnect substrate 5B formed in, for example, a reel-tape fashion, or a matrix-sheet fashion, as shown in FIG. 2, or FIG. 3, in accordance with a manufacturing method similar to that shown in FIGS. 2 to 4, by the method for connection as previously described, by forming metal bumps 2 on the backside face side of the metal interconnect substrate 5B of each of individualized semiconductor packages, selected as a non-defective product, as shown in the figure, and by three-dimensionally stacking the metal interconnect substrates one on top another by the same method for connection between respective upper and lower metal interconnect substrates. The metal bumps 2 formed on the backside face side of each of the metal interconnect substrates may be a gold stud bump or a plating-bump as shown with the present embodiment, however, for example, a solder bump may be alternatively formed to undergo melt bonding inside respective through-holes 3 in the respective metal interconnect substrate on a lower side while being heated. With the present embodiment, there is no need for forming through-holes in the respective semiconductor chips, and it is possible to implement three-dimensional connection even between different kinds of semiconductor chips through the intermediary of the respective metal interconnect substrates, and to make selection on a non-defective product by the individual package.

Having specifically described the invention developed by the inventor with reference to the embodiments of the invention as above, it is believed obvious that the invention be not limited to the embodiments, and that various changes and modifications may be made in the invention without departing from the spirit and scope thereof.

What is claimed is:

1. A method of manufacturing a semiconductor device, comprising the steps of:
    preparing a plurality of semiconductor chips that include a semiconductor chip of an upper tier provided with a first set of bumps and a semiconductor chip of an lower tier provided with a second set of bumps and a first set of through-holes; and a first set of electrodes formed along respective inner wall faces of the first set of through-holes;
    preparing an interconnect substrate provided with a resin substrate having a second set of through-holes, an interconnect formed on a face of the resin substrate, and a second set of electrodes formed along respective inner wall faces of the second set of through-holes;
    stacking the semiconductor chip of the upper tier on the semiconductor chip of the lower tier by inserting the first set of bumps of the semiconductor chip of the upper tier into the first set of through-holes of the semiconductor chip of the lower tier in such a way that a contact pressure between respective first set of bumps of the semiconductor chip of the upper tier and respective first set of electrodes of the semiconductor chip of the lower tier is caused due to deformation accompanied by plastic flow of the respective first set of bumps of the semiconductor chip of the upper tier; and
    stacking the semiconductor chip of the lower tier on the interconnect substrate by inserting the second set of bumps of the semiconductor chip of the lower tier into the second set of through-holes of the interconnect substrate in such a way that a contact pressure between respective second set of bumps of the semiconductor chip of the lower tier and respective second set of electrodes of the interconnect substrate is caused due to deformation accompanied by plastic flow of the respective second set of bumps of the semiconductor chip of the lower tier.

* * * * *